United States Patent
Maurice et al.

(10) Patent No.: US 7,256,103 B2
(45) Date of Patent: Aug. 14, 2007

(54) METHOD FOR MANUFACTURING A COMPOUND MATERIAL WAFER

(75) Inventors: Thibaut Maurice, Grenoble (FR); Phuong Nguyen, Grenoble (FR); Eric Guiot, Goncelin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 334 days.

(21) Appl. No.: 10/984,913

(22) Filed: Nov. 9, 2004

(65) Prior Publication Data

US 2005/0277267 A1 Dec. 15, 2005

(30) Foreign Application Priority Data

Jun. 10, 2004 (EP) .................................. 04291457

(51) Int. Cl.
*H01L 21/30* (2006.01)
*H01L 21/46* (2006.01)

(52) U.S. Cl. ............................... 438/458; 257/E21.568
(58) Field of Classification Search ................ 438/458
See application file for complete search history.

(56) References Cited

U.S. PATENT DOCUMENTS

| | | | |
|---|---|---|---|
| 5,966,620 A * | 10/1999 | Sakaguchi et al. | 438/455 |
| 6,020,252 A | 2/2000 | Aspar et al. | 438/458 |
| 6,027,988 A | 2/2000 | Cheung et al. | 438/513 |
| 6,037,988 A * | 3/2000 | Gu et al. | 375/240.16 |
| 6,225,192 B1 | 5/2001 | Aspar et al. | 438/460 |
| 6,344,404 B1 | 2/2002 | Cheung et al. | 438/513 |
| 6,527,031 B1 * | 3/2003 | Yanagita et al. | 156/584 |
| 2003/0124815 A1 | 7/2003 | Henley et al. | 438/460 |
| 2004/0147095 A1 * | 7/2004 | Yamazaki | 438/479 |
| 2005/0042840 A1 * | 2/2005 | Aga et al. | 438/458 |
| 2006/0040469 A1 * | 2/2006 | Aga et al. | 438/458 |

FOREIGN PATENT DOCUMENTS

| WO | WO 01/11667 | 2/2001 |
|---|---|---|
| WO | WO 2004/042779 | 5/2004 |

OTHER PUBLICATIONS

Michel Bruel, ,, XP-002294551, "Separation of Silicon Wafers by the Smart-Cut Method", Springer-Verlag, Mat Res Innovat, vol. 3, pp. 9-13. (1999).

* cited by examiner

*Primary Examiner*—Fernando L. Toledo
(74) *Attorney, Agent, or Firm*—Winston & Strawn LLP

(57) ABSTRACT

The invention relates to a method for manufacturing a compound material wafer. The technique includes forming a weakened zone in a source substrate, attaching the source substrate to a handle substrate to form a source-handle assembly, and thermally annealing the source-handle assembly to further weaken the weakened zone. The method also includes holding the assembly at a holding temperature, and detaching the source substrate from the assembly at the weakened zone at the holding temperature. The holding temperature is greater than room temperature but does not promote further weakening of the weakened zone.

17 Claims, 3 Drawing Sheets

Figure 1A:
Figure 1A:

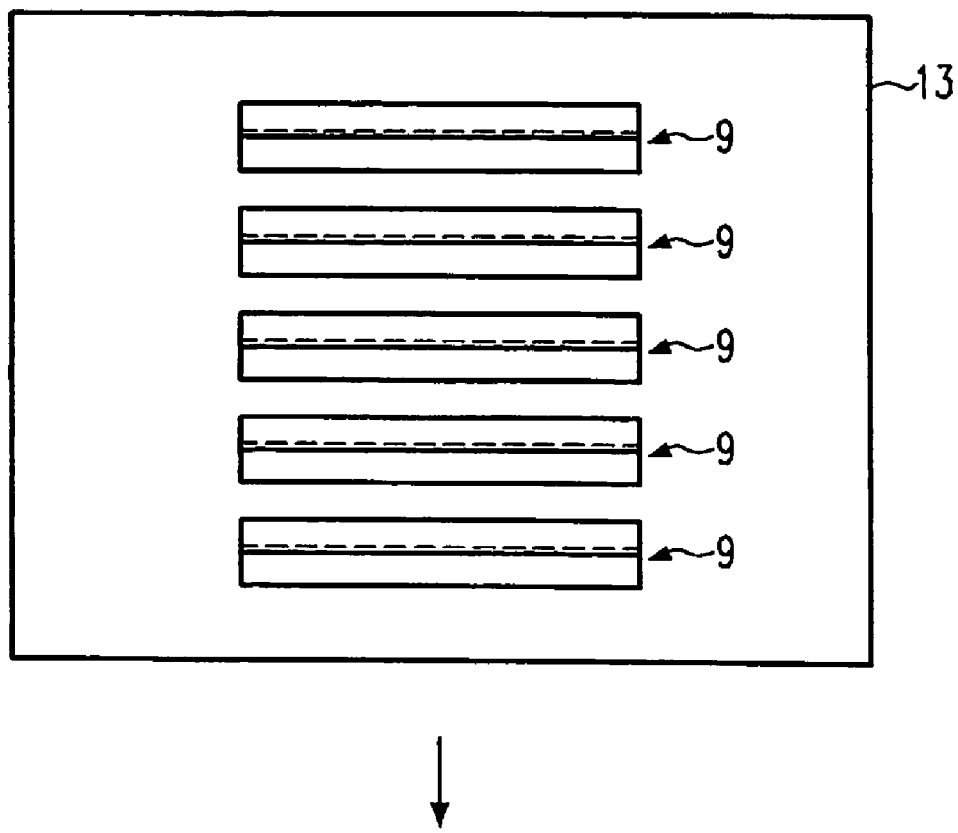
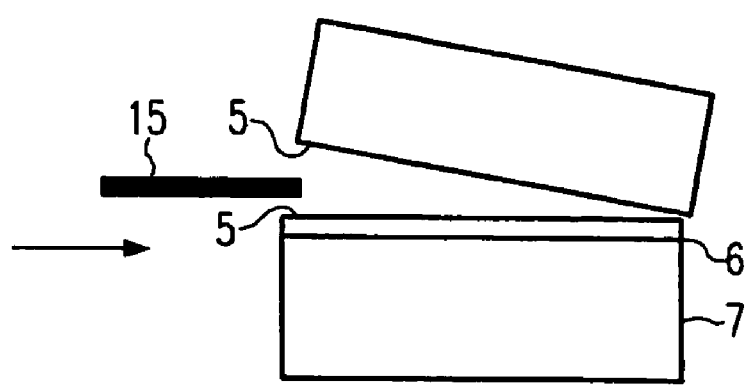

METHOD FOR MANUFACTURING A COMPOUND MATERIAL WAFER

BACKGROUND ART

The invention relates to a method for manufacturing compound material wafers. The invention is particularly applicable to fabricating semiconductor on quartz type compound material wafers.

The SMART-CUT® technique can be modified to fabricate compound material wafers, such as heterostructures. It is necessary to modify the SMART-CUT® technique to account for stresses inside the compound material wafers, as the heterostructures may have different physical properties. For example, the heterostructures may have different thermal expansion coefficients. These stresses can lead to bad quality wafers, or may even result in the complete destruction of samples during processing.

The SMART-CUT® technique includes three main process steps which are:
a) forming a predetermined weakened zone in a source substrate, b) attaching the source substrate to a handle substrate to form a source-handle assembly, and c) detaching the predetermined weakened zone by providing energy, in particular by applying thermal energy.

Since compound material wafers are composed of materials that usually have different physical properties, like different thermal expansion coefficients, a thermal annealing step leading to detachment cannot always be completely conducted because to do so would lead to excessive stress inside the source-handle assembly. One proposed solution, described for example in published International Application No. WO 01/11667, is to separate the weakening and detachment step into two parts. The first part consists of a thermal treatment to weaken the predetermined weakened zone, and the second part concerns physically detaching the source substrate at the predetermined weakened zone from the source-handle assembly such that a thin film is transferred from the source substrate onto the handle substrate. During the weakening step the predetermined weakened zone becomes weaker and weaker. However, the thermal budget, which is a combination of temperature and time, necessary to complete the detachment is not completely applied so as to prevent detrimental consequences due to the presence of high stresses inside the source-handle assembly. After the weakening step, the source-handle assembly is cooled down to room temperature to carry out the final detachment step. Additional energy is then provided, typically mechanical energy, to achieve the physical detachment. A blade is usually introduced at the weakened plane to supply the necessary energy.

This proposed process makes it possible to create compound material wafers, even if different thermal expansion coefficients are present. However, in the context of a mass production process, it has been observed that the quality of the final product is not always good enough which results in unsatisfactory production yields and thus an increase in costs per good quality wafer. During mass production, wafers are typically thermally treated in groups of 25 or more, wherein 100 wafers is a common amount. Thereafter, the source substrate of each wafer has to be mechanically detached using detachment equipment, such as a blade, at room temperature. The furnace is then free for further utilization. It has been observed that this type of processing increases the roughness of the wafer. Moreover, the transferred layer does not fully cover the surface of the handle substrate, and the free zone, called the exclusion zone, is large. Furthermore, the rim of the transferred layer has large irregularities at its circumference. All of these characteristics result in a reduced quality product.

SUMMARY OF THE INVENTION

The present invention provides an optimized method for manufacturing compound material wafers, which results in higher production yield and a better quality product as compared to use of the prior art technique. The method is particularly applicable to producing semiconductor on quartz type material wafers.

In an embodiment, a method for manufacturing a compound material wafer includes forming a weakened zone in a source substrate, attaching the source substrate to a handle substrate to form a source-handle assembly, and thermally annealing the source-handle assembly to further weaken the weakened zone. The method also includes holding the assembly at a holding temperature, and detaching the source substrate from the assembly at the weakened zone at the holding temperature. The holding temperature is greater than room temperature but does not promote further weakening of the weakened zone.

In a beneficial implementation, the source substrate is detached from the assembly by applying at least one of a blade, acoustic energy, vibrations, radiation, or a stream of liquid to the weakened zone. In an embodiment, the holding temperature is below about 150° C., or the holding temperature is below about 50° C. The source-handle assembly may advantageously be stored at or below the holding temperature for a predetermined period of time of hours or days prior to the detaching step, and the storing of the source-handle assembly may take place in a furnace or on a hotplate. In advantageous embodiments, the storing occurs at a temperature of between at least one of about 50° C. to about 150° C., or about 50° C. to about 140° C., or about 70° C. to about 120° C. In addition, the storing may take place under a neutral atmosphere, and the neutral atmosphere may be at least one of nitrogen or argon.

The method can be advantageously utilized when the source substrate is made of a first material and the handle substrate is made out of a second, different material. For example, the source substrate may be made of a semiconductor material and the handle substrate may be made of quartz. In addition, at least one of the first material or the second material may be at least one of silicon, a Type A(III)-Type B(V)-semiconductor, an alloy of a Type A(III)-Type B(V)-semiconductor, germanium, silicon carbide, synthetic quartz, or fused silica.

In an advantageous embodiment, the source-handle assembly is cooled after thermal annealing and then reheated before the detachment step. In implementations, the source-handle assembly is reheated to a temperature of between about 150° C. to about 250° C. prior to detachment, or is reheated to between about 180° C. to about 220° C. prior to detachment, or is reheated to about 200° C. prior to detachment. In addition, the source-handle assembly may be reheated for between about one to about three hours.

BRIEF DESCRIPTION OF THE DRAWING FIGURES

Other aspects, purposes and advantages of the invention will become clear after reading the following detailed description with reference to the attached drawings, in which:

FIGS. 1a to 1f schematically illustrate the steps for carrying out the method to fabricate a compound material wafer according to an embodiment of the invention.

Figure 2:
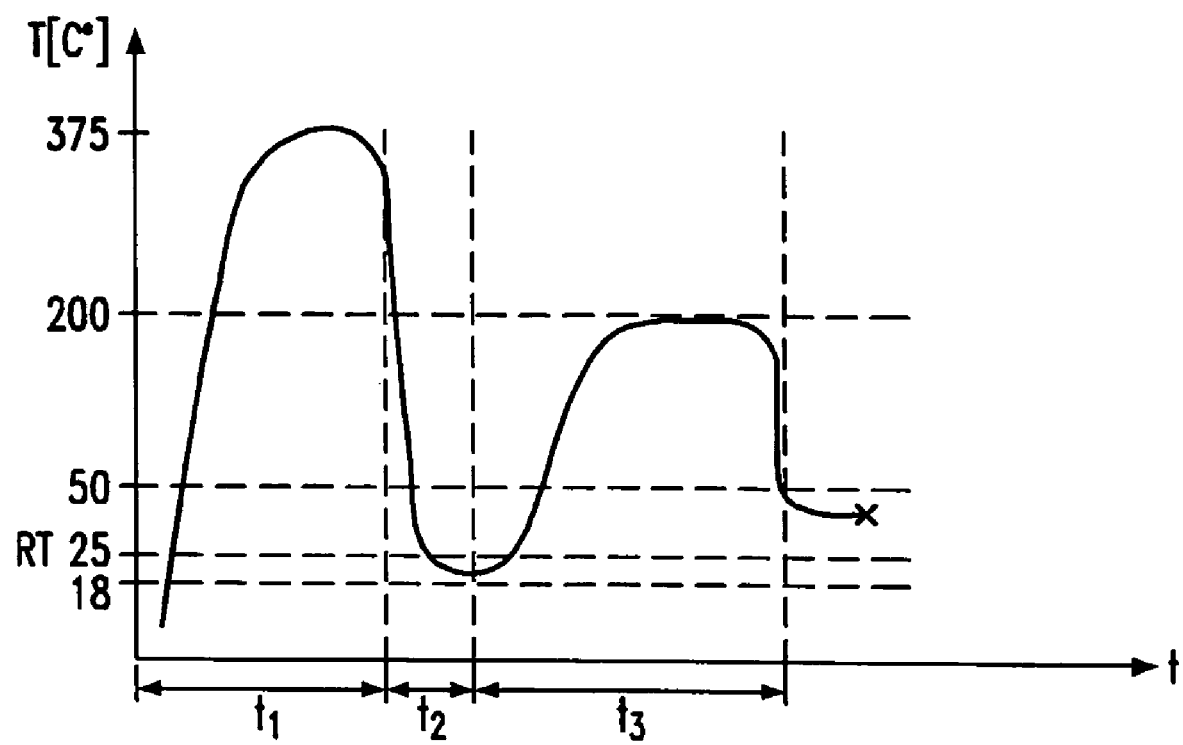

FIG. 2 is a graph of the temperature used during processing to heat the source-handle assembly over time according to an embodiment of the invention.

DETAILED DESCRIPTION OF THE PREFERRED EMBODIMENTS

A method for manufacturing a compound material wafer according to the invention includes forming a predetermined weakened zone in a source substrate, attaching the source substrate to a handle substrate to form a source-handle assembly, and then thermally annealing the source-handle assembly to further weaken the weakened zone. The assembly is then brought to a holding temperature that is greater than room temperature, but that is less than a temperature that promotes further weakening of the weakened zone. The source substrate is then detached from the assembly at the weakened zone.

Mechanical splitting at this detachment temperature results in a higher quality wafer. The defects associated with prior art methods that are created during the detachment process are reduced. In particular, the defects created by the introduction of a blade which increased the roughness of the wafer surface and formed large exclusion zones with irregular circumferences are minimized.

The term "room temperature" as used herein means temperatures that are in a range of about 18° C. to about 25° C., which correspond to typical clean room temperatures. The term "degree of weakening" as used herein is employed as a measure of strength of the predetermined weakened zone, wherein the two portions of the source substrate having the weakened zone therebetween are still connected to each other.

According to an advantageous embodiment, the detachment temperature is below about 150° C., and preferably is below 50° C. When the temperature is below about 150° C., it is possible to keep the degree of weakening substantially the same without an increase, and thus further undesired stresses are avoided. A blade can then be used to smoothly conduct detachment with only a few defects resulting in increased surface roughness. If mechanical detachment occurs at or below about 50° C., the creation of bows, in the case of silicon and quartz wafers, due to different thermal expansion coefficients is substantially prevented and the resulting wafers have a low roughness value.

According to a variant of the invention, the source-handle assembly is stored between the annealing and detachment steps at a holding temperature that is higher than room temperature. At this temperature, the predetermined weakened zone has essentially the same degree of weakening over the storage time. Since the holding temperature is chosen so that no further weakening occurs, no further stress is applied to the compound material wafer, and defects such as blue blistering or cracks are prevented. The wafers can be stored over a considerable time at the holding temperature, and thus are kept in a state which allows mechanical detachment of the source substrate to result in a low roughness value. Advantageously, storing can take place at a temperature of about 50° C. to about 150° C., in particular from about 50° C. to about 140° C., or from about 70° C. to about 120° C. The thermal budget provided to the bonded structure in these temperature ranges is sufficiently low to keep the degree of weakening more or less constant. This prevents further stress, whereas providing additional energy to generate detachment, like introducing a blade, does not lead to defects such as increased roughness and lower product quality. Thus, the production yield of good quality compound material wafers can be increased within these temperature ranges.

According to a preferred embodiment, the storing step can occur under a neutral atmosphere, such as for example, argon or nitrogen gas. Storing wafers under a neutral atmosphere prevents chemical reactions from taking place which may alter the required properties of the compound material wafer. Preferably, storage can take place in a furnace. A furnace has the advantage that a large number of wafers can be stored at the same time. The furnace used for this purpose may actually be the same one used to thermally anneal the wafer, the difference being that during the storing step the temperature is lower than during annealing. Preferably, a dedicated furnace for storage may be used, which can be adapted for individual removal of the wafers for further processing. In some cases, a hot plate can be advantageously used for storing. This is particularly advantageous in the case when the materials of the compound material wafers do not represent a significant difference in thermal expansion coefficients. For example, when the source and handle substrates are made out of the same material or similar materials (for example silicon-on-insulator type wafers). In this case the advantage is economical, as hot plates are relatively inexpensive.

According to a preferred embodiment, the source substrate can be made out of a first material and the handle substrate can be made out of a second material. The first and second material can be at least one of a group of materials consisting of silicon, a Type A(III)-Type B(V) semiconductor, an alloy of a Type A(III)-Type B(V) semiconductor, Germanium, silicon carbide, synthetic quartz or fused silica. Those materials play an important role in today's microelectronic, optoelectronic or micromechanical applications, and the demand for high quality but still affordable compound wafers made of these materials is high and can be satisfied by the fabrication method according to the invention. The invention is particularly applicable to fabricating silicon on quartz wafers, but it also can be utilized on non-heterogeneous systems such as Silicon on Insulator (SOI) wafers.

According to a preferred embodiment of the invention, the source-handle assembly is cooled down after thermal annealing, and then reheated before mechanically detaching the source substrate from the assembly. When a source-handle assembly is cooled, the detachment has not yet occurred, but the weakened zone has been further weakened to a certain degree. The wafer can be handled under low temperatures and transported to the respective place and equipment where it is further treated. Reheating is conducted up to a point at which the assembly can be further processed. Use of mechanical detachment after the product has been reheated results in a very good surface roughness. It is almost possible to get back to a nominal quality surface roughness after using an appropriate heat treatment. According to a specific aspect, the source-handle assembly is reheated to a temperature of about 150° C. to about 250° C., preferably to about 180° to about 220° C., or to about 200° C. In these temperature ranges, reheating provides a state in which the disadvantageous properties of a cooled assembly are substantially cured, and the reheated assembly is in a state from which a lower detachment temperature can be attained. The resulting reheated wafer is of good quality and low roughness. Use of temperatures in the range of about 100° C. to about 220° C. have proved to be especially advantageous, and a temperature of about 200° C. has proven to achieve very good results. In another advantageous embodiment, the source-handle assembly is reheated for about one to three hours, preferably for about two hours. After these reheating durations, the source-handle assembly is particularly suited for attaining a good surface roughness after detachment.

Referring to FIG. 1, an embodiment of the method for manufacturing compound material wafers is based on utilizing the SMART-CUT® technique. However, any other process suitable for manufacturing a compound-material wafer that includes a predetermined weakened zone that is weakened by thermal energy may be used.

Step 1a illustrates a source substrate 1, for example a silicon wafer of a predetermined size which may be up to 300 mm in diameter, into which atomic species are implanted at a predetermined dose and energy. The atomic species are preferably hydrogen ions 3. If desired, helium ions can be used, or a combination of hydrogen and helium, or hydrogen or helium with other rare gas ions wherein the hydrogen or helium are present in a predominant amount. The implanted atomic species create a predetermined weakened zone 5 which is substantially parallel to the surface of the source substrate 1.

Figure 1B:
Figure 1C:
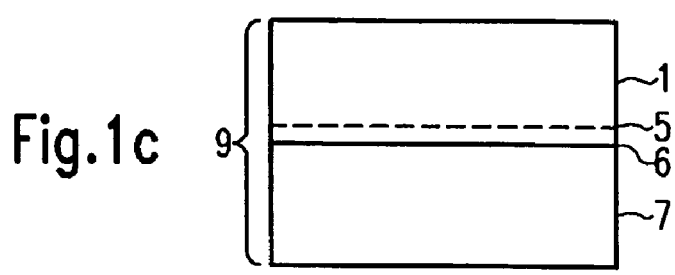

FIG. 1b illustrates a handle substrate 7, and in this embodiment it is a wafer of a material different from that of the source substrate. The handle substrate may be a quartz wafer, the surface of which is prepared such that in the following process step, illustrated in FIG. 1c, the handle substrate 7 can be bonded to the source substrate 1 to create the source-handle assembly 9. The source substrate 1 contacts the handle substrate 7 such that, in between the predetermined weakened zone 5 and the surface of the handle substrate 7, there is a thin film 6 of source substrate material that will be transferred onto the handle substrate 7.

The source-handle assembly 9 is then placed into a furnace 11 (see FIG. 1d) which is a batch type furnace in this embodiment. The batch type furnace can handle several source-handle assembly wafers 9 and anneal them at the same time. The process can also be carried out in the same way in a single wafer type furnace. In the furnace 11 the assemblies 9 are heated up to a predetermined temperature, which for a silicon on quartz source-handle assembly is on the order of about 300° C. to about 500° C. The wafers stay inside the furnace from about a couple of minutes to about a couple of hours. Furthermore, annealing can take place at a fixed temperature, or a certain temperature profile can be used inside the furnace to improve the quality of the wafers.

The annealing step weakens the predetermined weakened zone 5 up to a certain predetermined degree, and annealing is stopped prior to complete detachment. This process is used to prevent stress inside the source-handle assembly 9 which may arise due to differences in thermal expansion coefficients between the source substrate 1 and the handle substrate 7.

After the annealing process the source-handle assemblies 9 each now include a fragile weakened zone 5 and can be transferred into a storage furnace 13. The assemblies 9 are then heated to a holding temperature above room temperature but below the annealing temperatures, and in particular they are brought to a temperature where essentially no further weakening occurs. This typically is in a range of about 50° C. to about 150° C., or preferably from about 50° C. to about 140° C., or more preferably from about 70° C. to about 120° C.

Figure 1D:
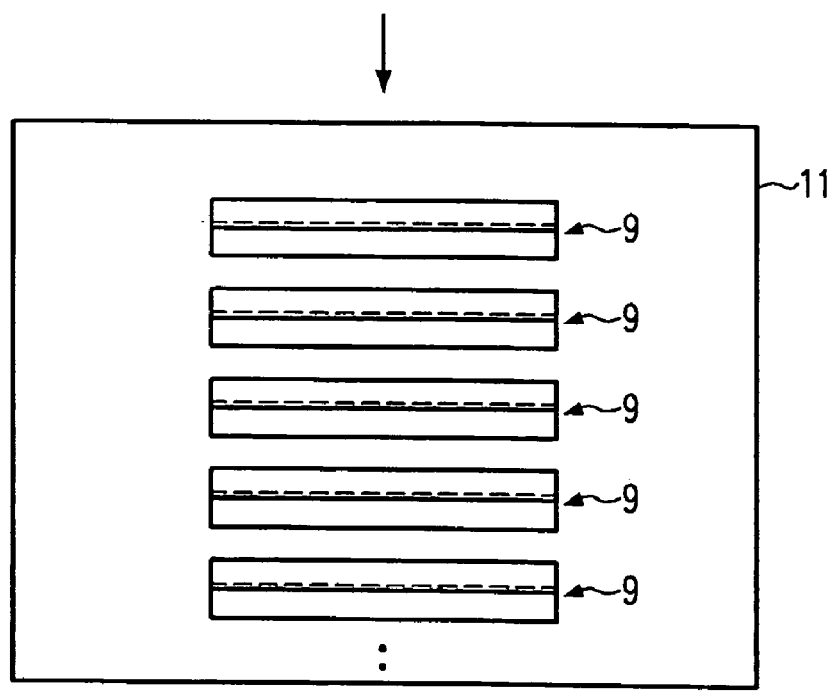

Instead of transferring the assemblies 9 into a dedicated storage furnace 13, the assemblies could stay in the furnace 11, shown in FIG. 1d for hours or days. In this case, however, the annealing temperature would have to be lowered to the holding temperature. According to another variant, in cases in which the differences in thermal expansion coefficients of the source substrate and the handle substrate are minor, hot plates could be used instead of the furnace. According to yet another variant, the assemblies can be brought to a holding temperature under a neutral atmosphere, in particular under an argon or nitrogen atmosphere to prevent any chemical reactions on the surface or other types of changes to the physical or chemical properties of the source-handle assembly 9.

The next step consists of detaching the source substrate at the predetermined weakened zone 5 from the remainder of the source-handle assembly. This step is shown in FIG. 1f. In an implementation, wafers are taken out of the storage furnace 13 one after the other and mechanical energy is used to detach the source substrate from the source-handle assembly 9 at the weakened zone 5. In this example, a blade 15 is applied to the source-handle assembly 9 to provoke detachment at the predetermined weakened zone 5. The thin material film 6 of the source substrate is thus transferred onto the handle substrate 7. Instead of introducing a blade to provide the additional energy, other energy sources could be applied, such as acoustic energy, vibrations, radiation or a stream of liquid under pressure.

For final detachment, the source-handle assembly 9 is brought to a detachment temperature. The detachment temperature is higher than room temperature, but is kept within a range of temperatures such that the predetermined weakened zone is not further weakened. Thus, a temperature is utilized wherein essentially no further weakening occurs. The assembly is held in a state where a mechanical means can be used to easily perform detachment, and the result is a good surface roughness at the detached surface. The detachment temperature is below about 150° C., and is preferably below about 50° C. In comparison, the term "room temperature" is in the range of about 18° C. to about 25° C.

An analysis of the surface quality of the thin film 6 confirmed that the surface quality stays constantly high, independent of when the wafer came out of the storage furnace 13. In addition, there is no evidence of enhanced roughness or lower quality at the circumference of the weakened zone, in particular at the location where the blade 15 was introduced. Moreover, an overall reduced roughness has been observed in comparison to source-handle assemblies that were not detached and/or stored at a temperature higher than room temperature. The result is thus an even further improved quality of the compound material wafers. In particular, the low frequency roughness of the surface is improved with respect to the state of the art compound material wafers.

According to another embodiment, the source-handle assembly 9 can be cooled down after the step of thermal annealing. It can be cooled to room temperature or a bit higher than room temperature, but other temperatures are also possible. In this state, the assembly 9 can be transported over long distances, for example, from thermal treatment equipment to mechanical detachment equipment. In some cases, the cooled assembly can even be transported between factories.

In practice, after thermally annealing the source-handle assembly 9 but before detaching the source substrate, the assembly is reheated to a temperature of about 150° C. to about 250° C., preferably to about 180° C. to about 220° C. or to about 200° C. The furnace 13 could be used for this purpose. Reheating may take place for about one to three hours, preferably for about two hours. After reheating, the source-handle assembly is in a cured state in which individual assemblies 9 can be taken out of the furnace and the source substrate can be mechanically detached as described above. Reheating provides a good quality product after the source substrate is mechanically detached despite the use of a cooling step after the annealing step.

FIG. 2 is a graph of the temperature T over time t for processing a compound wafer according to a further embodiment of the invention. During time $t_1$, the source-handle assembly 9 is thermally annealed to weaken the predetermined weakened zone. After annealing, the assembly 9 is cooled down during time $t_2$ to a room temperature of between about 18° C. and about 25° C. The duration of time $t_2$ can be considerably longer if the assembly is transported to another factory in this state. During the time $t_3$, the assembly is reheated to approximately 200° C. and then held at this temperature for a period of time, then again cooled down to a range that is above room temperature and below about 50° C. The cross at the end of the graph marks the mechanical detachment of the source substrate at this stage by a blade.

An exemplary embodiment of the manufacturing process has been described herein involving a silicon on quartz compound material wafer. However, it should be understood that the same advantageous process can also be applied to other wafer materials such as, for example, a Type A(III)-Type B(V)-semiconductor, or an alloy of a Type A(III)-Type B(V) semiconductor, or a Germanium material, or a silicon carbide thin film on a synthetic quartz material, or to a fused silica, or to silicon. The described method is particularly applicable to high volume compound wafer production due to the fact that the assemblies can be stored at the predetermined temperature and that detachment of the source can occur at a later time without detrimentally affecting final product quality.

What is claimed is:

1. A method for manufacturing a compound material wafer, comprising:
   forming a weakened zone in a source substrate;
   attaching the source substrate to a handle substrate to form a source-handle assembly;
   thermally annealing the source-handle assembly to further weaken the weakened zone; and
   mechanically detaching the source substrate from the assembly at the weakened zone while maintaining the assembly at a holding temperature that is greater than room temperature but that does not promote further weakening of the weakened zone.

2. The method of claim 1, which further comprises detaching the source substrate from the assembly by applying at least one of a blade, acoustic energy, vibrations, radiation, or a stream of liquid to the weakened zone.

3. The method of claim 1, wherein the source substrate is made of a semiconductor material and the handle substrate is made of quartz.

4. The method of claim 1, wherein the holding temperature is below about 150° C.

5. The method of claim 1, wherein the holding temperature is below about 50° C.

6. The method of claim 1, which further comprises storing the source-handle assembly at or below the holding temperature for a predetermined period of time of hours or days prior to the detaching step.

7. The method of claim 6, wherein the storing occurs at a temperature of between at least one of about 50° C. to about 150° C., or about 50°0 C. to about 140° C., or about 70° C. to 120° C.

8. The method of claim 6, wherein the storing takes place under a neutral atmosphere.

9. The method of claim 8, wherein the neutral atmosphere is at least one of nitrogen or argon.

10. The method of claim 6, wherein the storing of the source-handle assembly takes place in a furnace or on a hotplate.

11. The method of claim 1, wherein the source substrate is made of a first material and the handle substrate is made out of a second, different material.

12. The method of claim 11, wherein at least one of the first material or the second material is at least one of silicon, a Type A(III)-Type B(V)-semiconductor, an alloy of a Type A(III)-Type B(V)-semiconductor, germanium, silicon carbide, synthetic quartz, or fused silica.

13. The method of claim 1, which further comprises cooling the source-handle assembly after thermally annealing and then reheating before the detachment step.

14. The method of claim 13, wherein the source-handle assembly is reheated to a temperature of between about 150° C. to about 250° C. prior to detachment.

15. The method of claim 13, wherein the source-handle assembly is reheated to a temperature of between about 180° C. to about 220° C. prior to detachment.

16. The method of claim 13, wherein the source-handle assembly is reheated to a temperature of about 200° C. prior to detachment.

17. The method of claim 13, wherein the source-handle assembly is reheated for between about one to about three hours.

* * * * *

UNITED STATES PATENT AND TRADEMARK OFFICE
CERTIFICATE OF CORRECTION

PATENT NO. : 7,256,103 B2 Page 1 of 1
APPLICATION NO. : 10/984913
DATED : August 14, 2007
INVENTOR(S) : Maurice et al.

It is certified that error appears in the above-identified patent and that said Letters Patent is hereby corrected as shown below:

Title Page:
Item (75) Inventors, change inventor "Phuong Nguyen" to -- Nguyet Phuong Nguyen --.

Column 8:
Line 16 (claim 7, line 3), change "50°0 C." to -- 50° C. --.

Signed and Sealed this

Thirtieth Day of October, 2007

JON W. DUDAS
*Director of the United States Patent and Trademark Office*